United States Patent
Kim et al.

(10) Patent No.: US 7,808,838 B2
(45) Date of Patent: Oct. 5, 2010

(54) NONVOLATILE MEMORY DEVICES AND METHODS OF CONTROLLING THE WORDLINE VOLTAGE OF THE SAME

(75) Inventors: Min-Su Kim, Gyeonggi-do (KR); Hyung-Gon Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 109 days.

(21) Appl. No.: 12/185,548

(22) Filed: Aug. 4, 2008

(65) Prior Publication Data

US 2008/0291734 A1    Nov. 27, 2008

Related U.S. Application Data

(62) Division of application No. 11/285,446, filed on Nov. 22, 2005, now Pat. No. 7,423,908.

(30) Foreign Application Priority Data

Nov. 22, 2004 (KR) ............. 10-2004-0095862

(51) Int. Cl.
  *G11C 11/34* (2006.01)
  *G11C 16/04* (2006.01)
  *G11C 16/06* (2006.01)

(52) U.S. Cl. ............. 365/185.28; 365/185.02; 365/185.09; 365/185.19; 365/185.22; 365/185.23

(58) Field of Classification Search ............. 365/185.02, 365/185.19, 185.23

See application file for complete search history.

(56) References Cited

U.S. PATENT DOCUMENTS

| | | | |
|---|---|---|---|
| 5,457,650 A | 10/1995 | Sugiura et al. | |
| 5,937,005 A * | 8/1999 | Obuchi et al. | 375/224 |
| 7,099,193 B2 | 8/2006 | Futatsuyama | |
| 7,272,039 B2 | 9/2007 | Rudeck et al. | |
| 2003/0021148 A1 * | 1/2003 | Scheuerlein | 365/175 |
| 2004/0166639 A1 | 8/2004 | Lin et al. | |
| 2004/0223371 A1 | 11/2004 | Roohparvar | |
| 2005/0005045 A1 | 1/2005 | Kim et al. | |
| 2005/0141291 A1 | 6/2005 | Noguchi et al. | |

(Continued)

FOREIGN PATENT DOCUMENTS

JP    59-003965    1/1984

(Continued)

OTHER PUBLICATIONS

Notice to Submit Response in Korean Application No. 10-2004-0095862; Date of mailing; May 17, 2006.

(Continued)

*Primary Examiner*—Ly D Pham
(74) *Attorney, Agent, or Firm*—Myers Bigel Sibley & Sajovec, P.A.

(57) ABSTRACT

A nonvolatile memory device includes an array of memory cells arranged in rows and columns, the array of memory cells having wordlines associated therewith. A wordline voltage controller determines the levels of wordline voltages to be supplied to the respective wordlines and a wordline voltage generator generates the wordline voltages at the determined levels. Related methods are also provided.

9 Claims, 9 Drawing Sheets

U.S. PATENT DOCUMENTS

| | | | |
|---|---|---|---|
| 2005/0213385 A1* | 9/2005 | Hosono et al. | 365/185.17 |
| 2005/0237829 A1* | 10/2005 | Nakamura et al. | 365/199 |
| 2005/0248991 A1* | 11/2005 | Lee et al. | 365/185.28 |
| 2005/0248992 A1* | 11/2005 | Hwang et al. | 365/185.28 |
| 2005/0254302 A1* | 11/2005 | Noguchi | 365/185.17 |
| 2005/0254309 A1* | 11/2005 | Kwon et al. | 365/185.28 |
| 2005/0265079 A1 | 12/2005 | Shirota | |
| 2005/0286308 A1* | 12/2005 | Nagashima | 365/185.22 |
| 2006/0092703 A1* | 5/2006 | Chae et al. | 365/185.18 |
| 2006/0239081 A1 | 10/2006 | Roohparvar | |

FOREIGN PATENT DOCUMENTS

| | | |
|---|---|---|
| JP | 07-029383 | 1/1995 |
| JP | 2003-109389 | 4/2003 |
| JP | 2003-123493 | 4/2003 |
| JP | 2004-110871 | 4/2004 |
| KR | 1997-0060242 | 8/1997 |
| KR | 1999-0045050 | 6/1999 |
| KR | 1020020047770 | 6/2002 |
| KR | 1020040047725 A | 6/2004 |
| KR | 2005-32692 | 4/2005 |
| KR | 1020050075548 | 7/2005 |

OTHER PUBLICATIONS

English translation of Notice to Submit Response in Korean Application No. 10-2004-0095862; Date of mailing May 17, 2006.

Korean Intellectual Property Office Notice to File a Response/Amendment to the Examination Report for Application No. 2004-0095863; Date of mailing May 27, 2006.

English translation of Korean Intellectual Property Office Notice to File a Response/Amendment to the Examination Report for Application No. 2004-0095863; Date of mailing May 27, 2006.

Notice to Files a Response/Amendment to the Examination Report for Korean Application No. 10-2005-0050468; date of mailing Aug. 30, 2006.

English translation of Notice to File a Response/Amendment to the Examination Report for Korean Application No. 10-2005-0050468; date of mailing Aug. 30, 2006.

* cited by examiner

NONVOLATILE MEMORY DEVICES AND METHODS OF CONTROLLING THE WORDLINE VOLTAGE OF THE SAME

CROSS-REFERENCE TO RELATED APPLICATION

This U.S. non-provisional patent application is a divisional of U.S. patent application Ser. No. 11/285,446, now U.S. Pat. No. 7,423,908 filed on Nov. 22, 2005, which claims priority under 35 U.S.C. §119 to Korean Patent Application 2004-95862 filed on Nov. 22, 2004, the disclosures of which are hereby incorporated by reference in their entirety.

BACKGROUND OF THE INVENTION

The present invention relates generally to nonvolatile semiconductor memory devices, and, more particularly, to controlling the wordline voltage in nonvolatile memory devices.

Nonvolatile memory devices retain data stored therein even if there is no power. Among nonvolatile memories, a flash memory has a function of electrically and collectively erasing data of cells. Therefore, flash memories are widely used for computers and memory cards.

Flash memories may be divided into NOR flash memories and NAND flash memories in accordance with the connection state between cells and bit lines. In general, because a NOR flash memory typically has high current consumption, the NOR flash memory may be less advantageous to high integration but may provide high speed. Because the NAND flash memory generally uses smaller cell current than the NOR flash memory, the NAND flash memory may be advantageous to high integration.

FIG. 1 illustrates the structure of a memory cell array 110 of a conventional NAND flash memory. FIG. 1 illustrates the structure of a block among a plurality of memory cell blocks included in the memory cell array 110.

Referring to FIG. 1, the NAND flash memory includes the memory cell array 110 as a storage region for storing information. The memory cell array 110 consists of a plurality of blocks and each block consists of a plurality of cell strings (sometimes referred to as NAND strings). Pluralities of floating gate transistors M0 to M31 are included in each of the cell strings. The plurality of floating gate transistors M0 to M31 are serially connected between a string selection transistor SST and a ground selection transistor GST arranged in each of the strings. A plurality of wordlines WL0 to WL31 are arranged so as to cross the NAND strings. The respective wordlines WL0 to WL31 are connected to the control gates of the floating gate transistors M0 to M31 corresponding to the respective NAND strings. A programming/reading voltage is applied through the wordlines WL0 to WL31 such that data is programmed/read to/from the corresponding floating gate transistors M0 to M31.

A page buffer circuit is provided in the flash memory to store data in the memory cell array 110 or to read data from the memory cell array 110. As is generally well known, the memory cells of the NAND flash memory may be erased or programmed using a Fowler-Nordheim tunneling current. Methods of erasing and programming a NAND flash electrically erasable and programmable read only memory (EEPROM) are disclosed in U.S. Pat. No. 5,473,563 entitled "Nonvolatile Semiconductor Memory," and in U.S. Pat. No. 5,696,717 entitled "Nonvolatile Integrated Circuit Memory Devices Having Adjustable Erase/Program Threshold Voltage Verification Capability."

FIG. 2 illustrates change in a wordline voltage according to a conventional programming method. To correctly control dispersion of threshold voltages of flash memory cells, the flash memory cells are programmed by an incremental step pulse programming (ISPP) method. A circuit for generating a program voltage in accordance with the ISPP method is disclosed in U.S. Pat. No. 5,642,309 under the title "Auto-Program Circuit in a Nonvolatile Semiconductor Memory Device."

A program voltage Vpgm in accordance with the ISPP programming method sequentially increases as program loops of a program cycle are repeated as illustrated in FIG. 2. Each program loop consists of a program period and a program verification period. The program voltage Vpgm increases by a predetermined increment ΔVpgm from a predetermined initial program voltage every program loop. The program voltage Vpgm applied to the respective wordlines WL0 to WL31 is maintained uniformly with respect to the program loops.

However, because the equal program voltage Vpgm is applied to the wordlines WL0 to WL31 regardless of the structural characteristics of the wordlines, program time increases. For example, in the outermost transistors M0 and M31 among the plurality of floating gate transistors M0 to M31 included in each of the memory cell blocks, the coupling ratio of the floating gates is typically smaller than the coupling ratio of the floating gates in the other transistors M1 to M30 due to the structure of the memory cell array. Therefore, the outermost transistors M0 and M31 typically require more program loops than the other wordlines M1 to M30. Such an increase in the program loops may cause an increase in the program time such that the performance of the flash memory device may deteriorate.

SUMMARY OF THE INVENTION

According to some embodiments of the present invention, a nonvolatile memory device includes an array of memory cells arranged in rows and columns, the array of memory cells having wordlines associated therewith. A wordline voltage controller determines the levels of wordline voltages to be supplied to the respective wordlines and a wordline voltage generator generates the wordline voltages at the determined levels.

In other embodiments, the wordline voltage controller determines the levels of the wordline voltages based on the positions of the wordlines In still other embodiments, when the wordline is positioned in the outermost portion of the block included in the array, the wordline voltage of the wordline has a higher value than the wordline voltages of the other wordlines.

In still other embodiments, the wordline voltage is either a reading voltage or a programming voltage.

In still other embodiments, the wordline voltage controller comprises an initial level setting unit for setting the initial levels of the wordline voltages to be supplied to the respective wordlines and a level-determining unit for determining the levels of the wordline voltages based on the initial levels.

According to further embodiments of the present invention, a nonvolatile memory device includes an array of memory cells arranged in rows and columns, the array of memory cells having wordlines associated therewith. A program controller sequentially activates the step control signals during a program cycle. A wordline voltage controller determines the levels of wordline voltages to be supplied to the respective wordlines responsive to the step control signals and a wordline voltage generator generates the wordline voltages at the determined levels.

In further embodiments, the wordline voltage controller determines the levels of the wordline voltages based on the positions of the wordlines.

In further embodiments, when the wordline is positioned in the outermost portion of the block included in the array, the wordline voltage of the wordline has a higher value than the other wordlines that perform a program of the same step.

In further embodiments, the wordline voltage controller comprises an initial level setting unit for setting the initial levels of the wordline voltages supplied to the respective wordlines and a level determining unit for determining the levels of the wordline voltages in response to the step control signals and the initial levels.

According to other embodiments of the present invention, there is provided a method of controlling a wordline voltage of a nonvolatile memory device having a memory cell array of memory cells arranged in rows and columns, the array of memory cells having wordlines associated therewith. The method comprising the steps of determining the levels of wordline voltages to be supplied to the respective wordlines and generating the wordline voltages having the determined levels.

In other embodiments, the levels of the wordline voltages are determined based on the positions of the wordlines.

In still other embodiments, when the wordline is positioned in the outermost portion of the block included in the array, the wordline voltage of the wordline has a higher value than the other wordlines.

In still other embodiments, the wordline voltage is either a reading voltage or a programming voltage.

In still other embodiments, determining the levels of the wordline voltages comprises setting the initial levels of the wordline voltages to be supplied to the respective wordlines and determining the levels of the wordline voltages based on the initial levels.

According to further embodiments of the present invention, there is provided a method of controlling a wordline voltage of a nonvolatile memory device having a memory cell array of memory cells arranged in rows and columns, the array of memory cells having wordlines associated therewith. The method comprising sequentially activating the step control signals during a program cycle, determining the levels of the wordline voltages to be supplied to the respective wordlines in response to the step control signals, and generating the wordline voltages having the determined levels.

In further embodiments, the levels of the wordline voltages are determined based on the positions of the wordlines.

In still further embodiments, when the wordline is positioned in the outermost portion of the block included in the array, the wordline voltage of the wordline has a higher value than the other wordlines that perform a program of the same step.

In still further embodiments, determining the levels of the wordline voltages comprises setting the initial levels of the wordline voltages to be supplied to the respective wordlines, performing a count-up operation whenever the step control signals are generated using the initial level values as a start, and determining the levels of the wordline voltages in response to the counting result performed by the counter.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS

Figure 1:
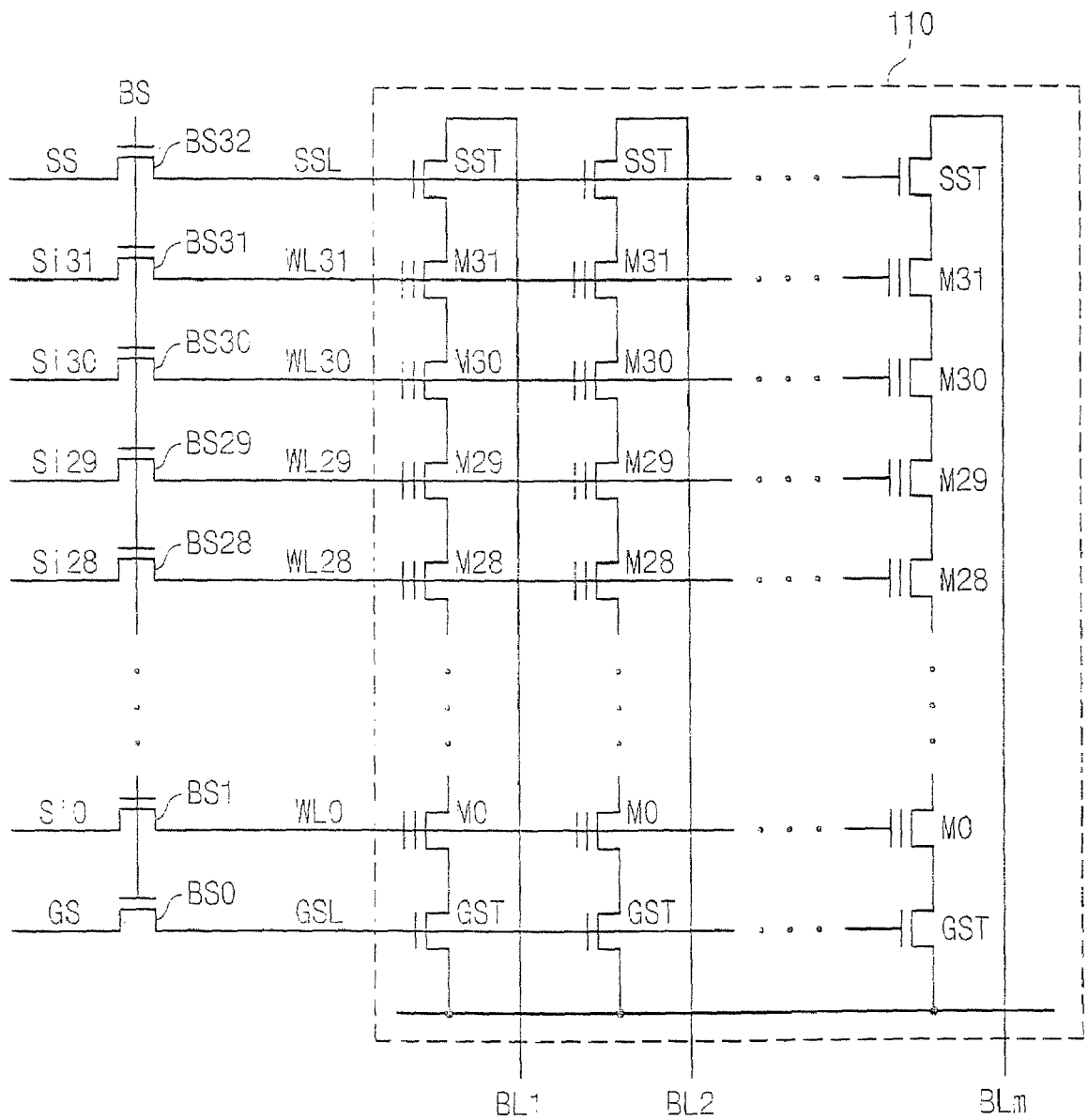
FIG. 1 illustrates the structure of a memory cell array of a conventional NAND flash memory.
Figure 2:
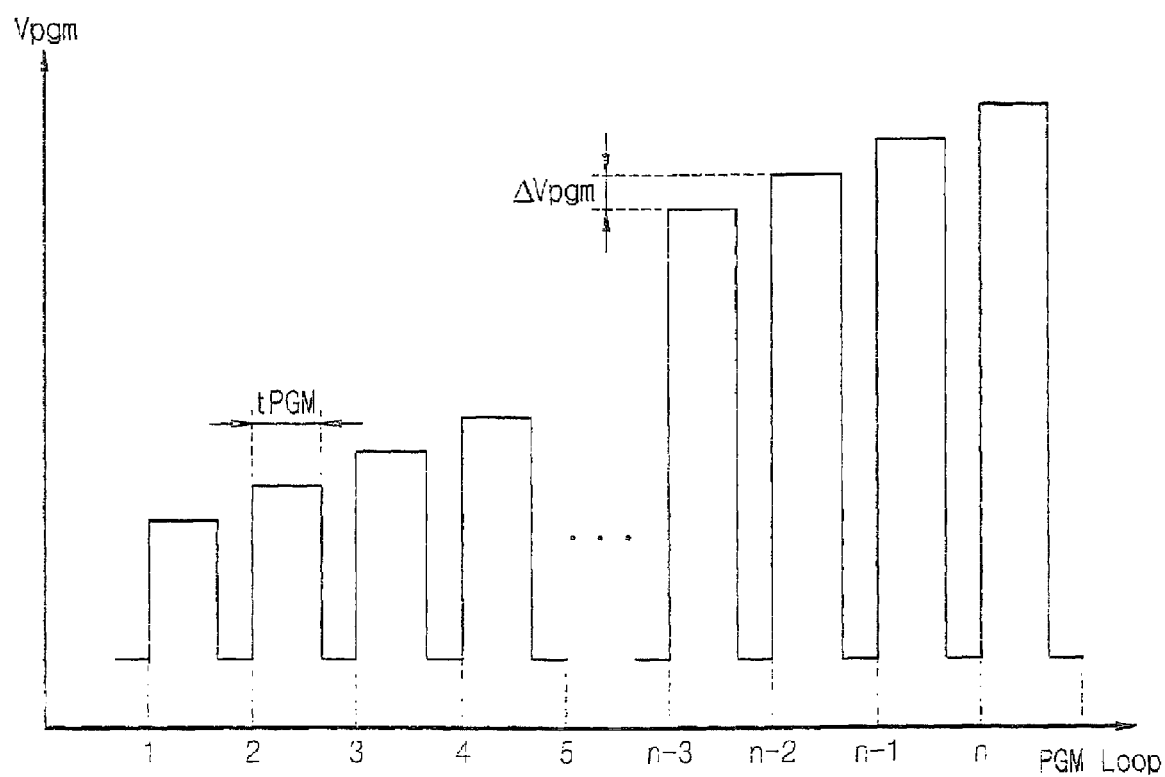
FIG. 2 illustrates change in a wordline voltage of a nonvolatile memory device according to a conventional programming method.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to some embodiments of the present invention, the levels of wordline voltages to be supplied to the respective wordlines of a nonvolatile memory device are determined in accordance with information on the positions of the wordlines. As a result, it may be possible to improve reading efficiency and to prevent an increase in the number of program loops in accordance with the positions of the wordlines such that it is possible to improve the programming characteristic of the nonvolatile memory device.

Figure 3:
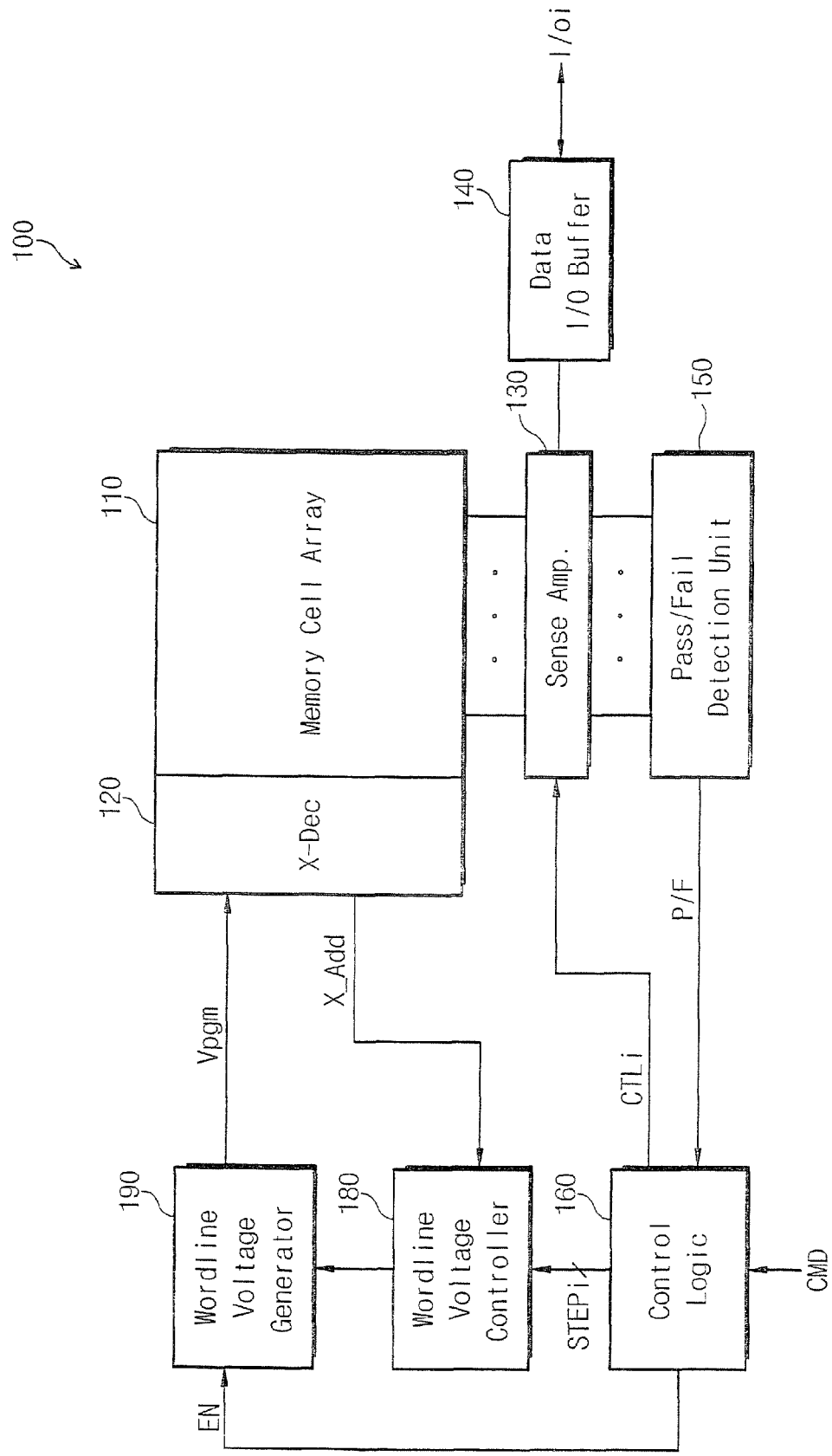
FIG. 3 is a block diagram of a nonvolatile memory device according to some embodiments of the present invention.

FIG. 3 is a block diagram of a nonvolatile memory device 100 according to some embodiments of the present invention. The nonvolatile memory device 100 illustrated in FIG. 3 is a flash memory device. However, it is understood by those skilled in the art that the present invention may be embodied as other memory devices, such as a mask read only memory (MROM), a programmable read-only memory (PROM), and/or a ferroelectric random access memory (FRAM).

Referring to FIG. 3, the nonvolatile memory device 100, according to some embodiments of the present invention, comprises a memory cell array 110 including a plurality of memory cells, a wordline voltage controller 180 for determining the levels of wordline voltages to be supplied to the respective wordlines, and a wordline voltage generator 190 for generating a wordline voltage in accordance with the levels determined by the wordline voltage controller 180. The wordline voltage controller 180 determines the levels of wordline voltages to be supplied to the respective wordlines in accordance with information on the position of the selected wordline. For example, a wordline voltage of a higher level than the level of the wordline voltage supplied to the other wordlines WL1 to WL30 is supplied to the outermost wordlines (for example, the first wordline WL0 and the last wordline WL31) of the blocks that constitute the memory cell array 110. The initial level of a wordline voltage is controlled such that the wordline voltage of a higher level than the level of the wordline voltage supplied to the other wordlines WL1 to WL30 is supplied to the outermost wordlines WL0 and WL31 of the blocks that constitute the memory cell array 110. It is possible to set the initial levels of the wordline voltages of the respective wordlines. The wordline voltage is supplied to a part, such as a main region or a spare region or to the entire region of the selected wordline. In some embodiments, the wordline voltage applied to each of the wordlines is a program voltage used when data is written in the memory cell array 110 or a read voltage used when data stored in the memory cell array 110 is read. The wordline voltage controller 180 determines the level of a wordline voltage in accordance with information on the position of the wordline and the number of times at which a program loop is repeated when the wordline voltage is used as the program voltage.

Because different wordline voltages are supplied in accordance with the positions of the wordlines, it may be possible to compensate for difference in the coupling ratio in accordance with the positions of the wordlines. As a result, it may be possible to improve the reading efficiency of the nonvolatile memory device 100. The number of program loops required by each of the wordlines during programming may be reduced such that the programming characteristic of the nonvolatile memory device is improved. A structure of the nonvolatile memory device 100, in accordance with some embodiments of the present invention, is described hereafter.

The memory cell array 110 has a similar structure as the memory cell array illustrated in FIG. 1. A plurality of rows (or wordlines) and a plurality of columns (or bit lines) cross each other in each of the memory cells included in the memory cell array 110. Each of the memory cells stores 1-bit data or n-bit data (n is an integer equal to or larger than 2). An X-decoder 120, which is a row selecting circuit, decodes a row address supplied by a row address buffer (not shown) to select at least one wordline among the plurality of wordlines. A wordline voltage is supplied from the wordline voltage generator 190 to the selected row (that is, the selected wordline). The wordline voltage applied to each of the wordlines is used for a reading operation or programming/erasing operations. The row address X-Add decoded by the X-decoder 120 is applied to the wordline voltage controller 180. The row address X-Add decoded by the X-decoder 120 corresponds to information on the position of the selected wordline. The wordline voltage controller 180 determines the levels of the wordline voltages to be supplied to the respective wordlines in response to the decoded row address X-Add.

The control logic 160 controls a sense amplifier 130. The sense amplifier 130 reads data from the memory cell array 110 during reading/verifying operations. The data read during the reading operation is output to the outside through a data input and output circuit 140. The data read during the verifying operation is output to a pass/fail detecting unit 150. The sense amplifier 130 receives data to be written in the memory cell array 110 during the programming operation through the data input and output circuit 140. The sense amplifier 130 drives bit lines by a program voltage, such as a ground voltage or a program inhibition voltage such as a power source voltage, in accordance with input data.

The pass/fail detecting unit 150 determines whether the data values output from the sense amplifier 130 during a programming/erasing verifying operation are the same as pass data. The pass/fail detecting unit 150 outputs a pass/fail signal P/F as a programming/erasing verifying result to the controlling logic 160.

The controlling logic 160 controls the programming operation of the nonvolatile memory device 100. The controlling logic 160 activates the wordline voltage generator 190 when the programming operation starts. The controlling logic 160 supplies pluralities of step control signals STEPi to the wordline voltage controller 180 as the program loop proceeds. The wordline voltage controller 180 determines the level of the wordline voltage to be used for programming in response to the step control signals STEPi and information on the position of the wordline. The wordline voltage generator 190 generates the wordline voltage having a level determined by the wordline voltage controller 180.

Figure 4:
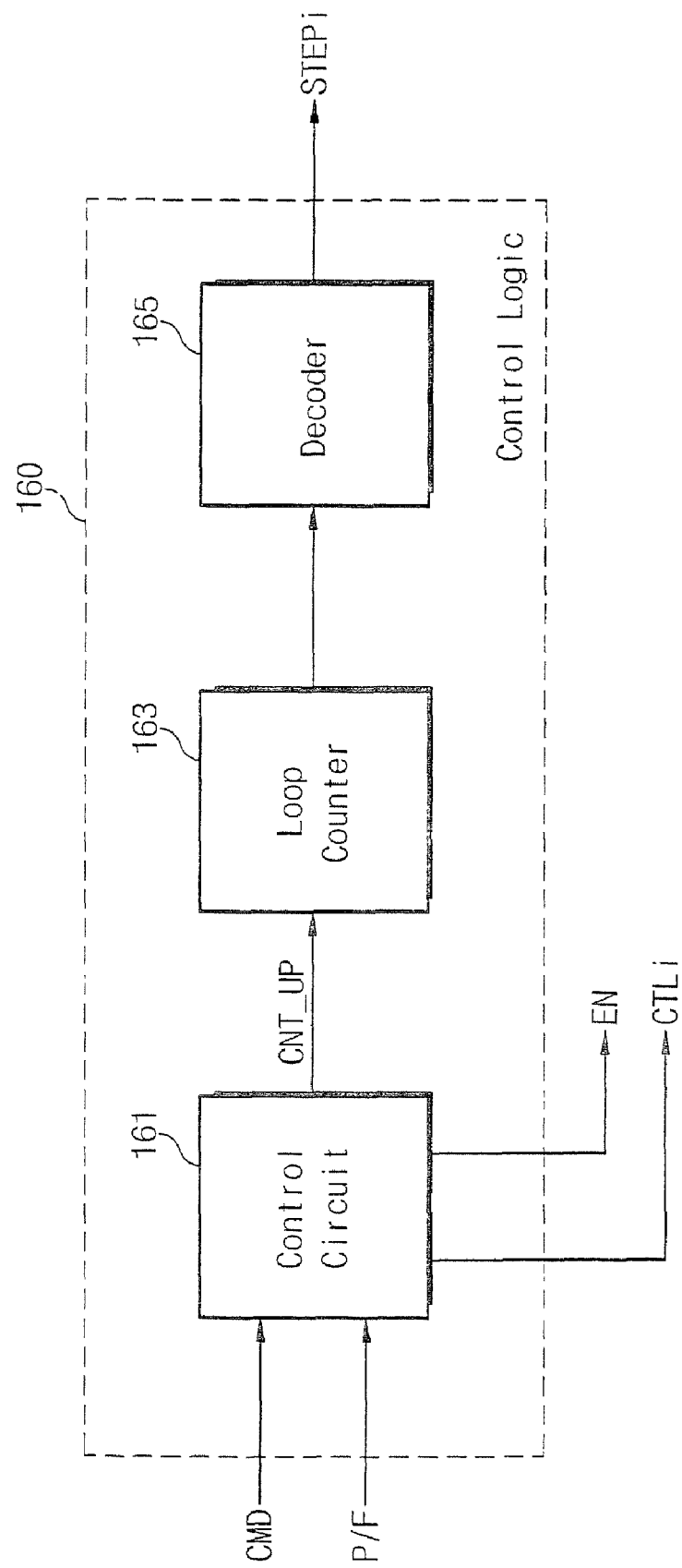
FIG. 4 is a detailed block diagram of the controlling logic illustrated in FIG. 3 according to some embodiments of the present invention.

FIG. 4 is a detailed block diagram of the control logic 160 illustrated in FIG. 3. Referring to FIG. 4, the control logic 160 includes a control circuit 161, a loop counter 163, and a decoder 165. The control circuit 161 activates the wordline voltage generator 190 in response to a command CMD that informs a program cycle and controls the operation of the sense amplifier 130 during the respective program loops of the program cycle. The controlling circuit 161 activates a count-up signal CNT_UP in response to the pass/fail signal P/F from the pass/fail detecting unit 150. For example, when the pass/fail signal P/F represents that at least one among the data values output from the sense amplifier 130 do not have the pass data value (that is, the programming operation of the current program loop is not correctly performed), the control circuit 161 activates the count-up signal CNT_UP. When the programming operation of the current program loop is correctly performed, the control circuit 161 deactivates the count-up signal CNT_UP and terminates the program cycle.

The loop counter 163 counts the number of program loops in response to the count-up signal CNT-UP generated by the control circuit 161. The decoder 165 decodes the output of the loop counter 163 to generate the step control signals STEPi (I=0–n). The step control signals STEPi are input to the wordline voltage controller 180. As the output value of the loop counter 163 increases, the step control signals STEPi are sequentially activated. When the step control signals STEPi are sequentially activated, the wordline voltage controller 180 determines the levels of wordline voltages based on the activated step control signals STEPi and information on the positions of the wordlines.

Figure 5:
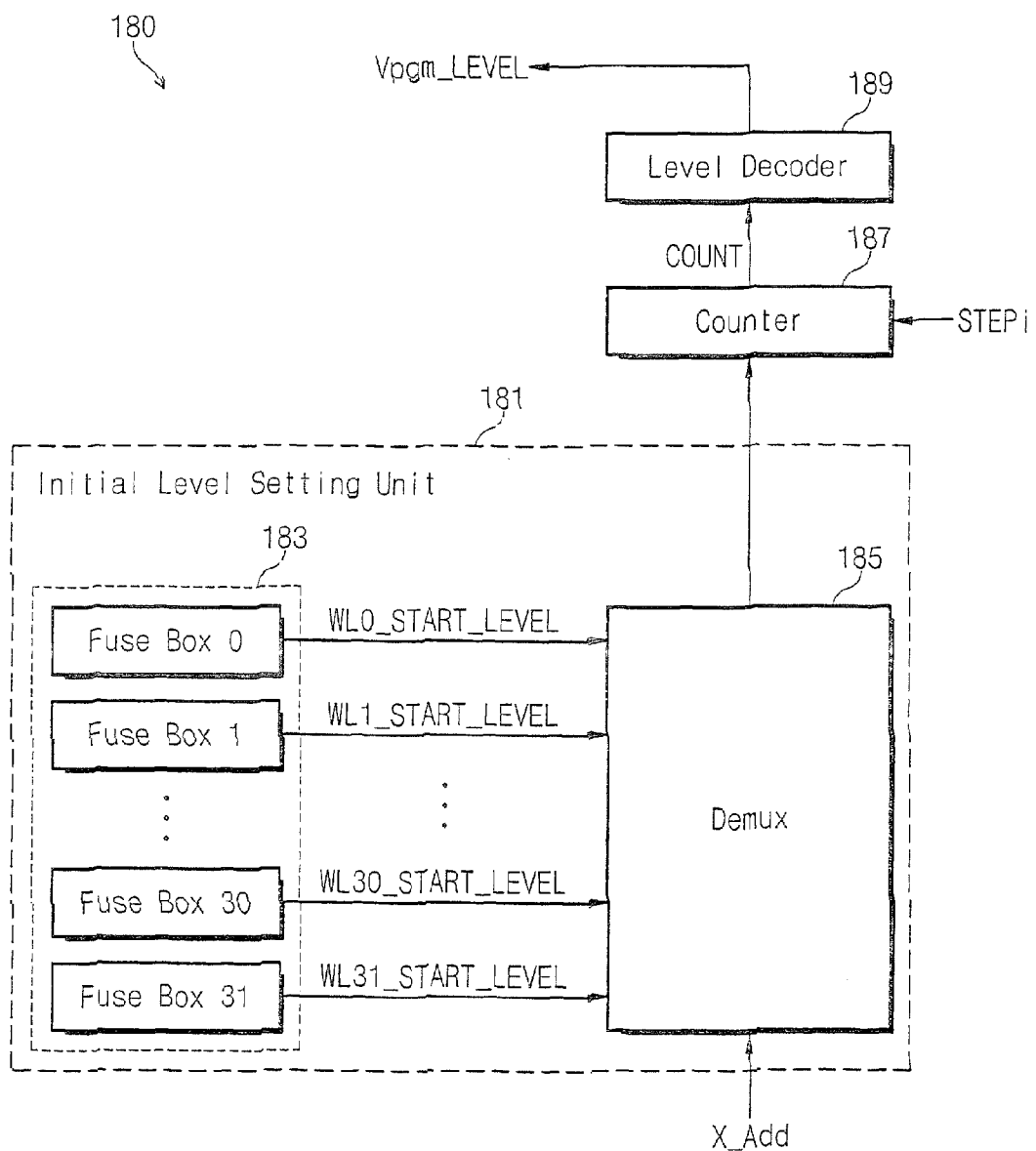
FIGS. 5 and 6 are block diagrams of wordline voltage controllers according to some embodiments of the present invention, which are illustrated in FIG. 3.
Figure 6:
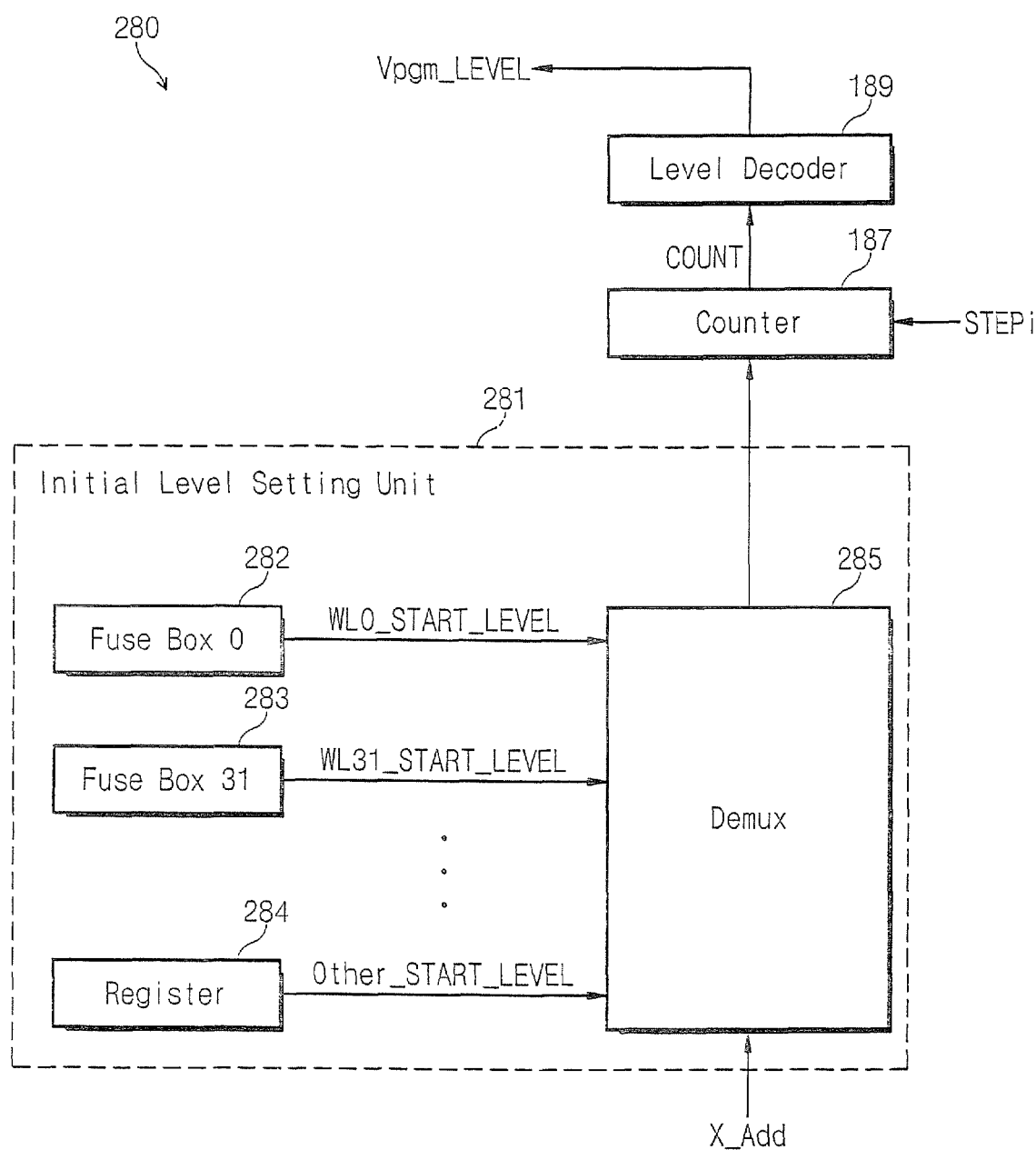

FIGS. 5 and 6 are block diagrams of the wordline voltage controllers 180 and 280 of FIG. 3 in accordance with some embodiments of the present invention. Referring to FIGS. 5 and 6, the wordline voltage controllers 180 and 280 include initial level setting units 181 and 281, a counter 187, and a level decoder 189. The structure and function of the wordline voltage controller 280 illustrated in FIG. 6 are similar to the structure and function of the wordline voltage controller 180 illustrated in FIG. 5 except that a part of the structure of the initial level setting unit 281 is different from the structure of the initial level setting unit 181. Therefore, for convenience, among the elements illustrated in FIG. 6, the same elements as the elements illustrated in FIG. 5 are denoted by the same reference numerals.

First, referring to FIG. 5, the initial level setting unit 181 includes a plurality of fuse boxes 183 as means for storing the initial values of the respective wordlines. Each of the fuse boxes includes a plurality of fuses. The initial voltage levels WL0_START_LEVEL, ..., and WL31_START_LEVEL of the respective wordlines are set by the cutting combinations of the plurality of fuses included in each of the fuse boxes.

According to the embodiments of FIG. 5, each of the fuse boxes may include four fuses that can represent four bits of data. The respective bits represent the value of 1 or 0 according to whether the fuses corresponding to the respective bits are cut or not. For example, the initial voltage levels WL0_START_LEVEL and WL31_START_LEVEL of the first and $32^{nd}$ wordlines (that is, the outermost wordlines of the memory cell block) are set as the value of "0011" and the initial voltage levels WL1_START_LEVEL to WL30_START_LEVEL of the second to $31^{st}$ wordlines are set as the value of "0000" according to whether the fuses are cut. The first to $32^{nd}$ wordlines may be set to have different values. The initial voltage levels of the wordlines may be set by various methods based on the intention of a user or the characteristics of the wordlines in accordance with various embodiments of the present invention.

The initial voltage levels WL0_START_LEVEL, ..., and WL31_START_LEVEL of the respective wordlines set to the plurality of fuse boxes 183 are provided to a demultiplexer 185. The demultiplexer 185 selects one of the plurality of initial voltage levels WL0_START_LEVEL, ..., and WL31_START_LEVEL in response to the row address X-Add decoded by the X-decoder 120. The decoded row address X-Add means information on the position of the selected wordline in order to apply a wordline voltage. The selected initial voltage level is provided as the initial value of the counter 187.

As illustrated in FIG. 5, the initial level setting unit 181 may consist of the plurality of fuse boxes 183. The initial level setting unit 281 may consist of a combination of a plurality of fuse boxes 282 and 283 and a register 284 as illustrated in FIG. 6. Although not shown in the drawing, the initial level setting unit 281 may consist of at least one register. It is understood to those skilled in the art that the structure of the initial level setting units 181 and 182 may vary. Here, the register 284 may be formed using wired logic for storing fixed data. In such a case, additional control logic and a control signal for controlling the register 284 are not needed, such that it is possible to simplify the structure of a circuit and to simplify control of the circuit.

The counter 187 sets the initial voltage level value of the wordline input from the initial level setting unit 181 as the initial value of the counter 187. Then, the counter 187 performs a count up operation whenever the step control signals STEPi are sequentially activated by the control logic 160. The counting result COUNT generated by the counter 187 is input to the level decoder 189. The level decoder 189 decodes the counting result COUNT generated by the counter 187 to determine the level Vpgm_LEVEL of the wordline voltage. The level Vpgm_LEVEL of the wordline voltage determined by the level decoder 189 is input to the wordline voltage generator 190. The wordline voltage generator 190 generates a wordline voltage having the voltage level Vpgm_LEVEL determined by the level decoder 189. The generated wordline voltage is used as the program voltage.

On the other hand, when the nonvolatile memory device 100 performs a reading operation, the control logic 160 does not generate the activated step control signals STEPi. Therefore, during the reading operation, the step control signals STEPi are not counted by the counter 187 so that the counter 187 outputs the initial voltage level determined by the initial level setting units 181 and 182 as the counting result COUNT. As a result, the level decoder 189 determines the level of a wordline voltage to be used for reading based on the initial voltage level and the wordline voltage generator 190 generates a wordline voltage of the level determined by the level decoder 189.

Figure 7:
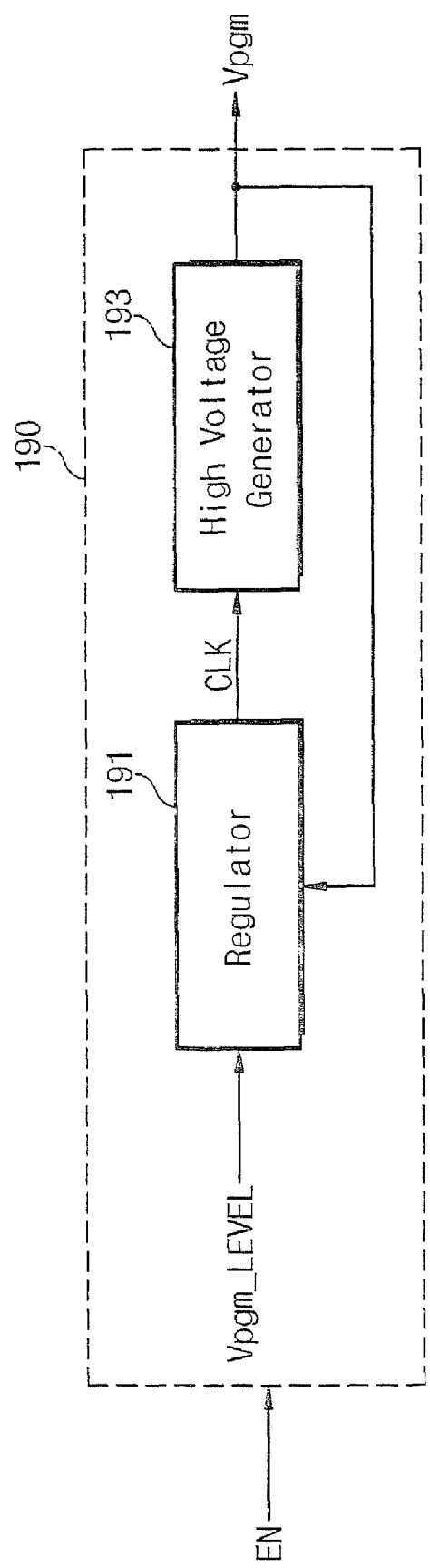
FIG. 7 is a block diagram of the wordline voltage generator illustrated in FIG. 3 according to some embodiments of the present invention.

FIG. 7 is a block diagram of the wordline voltage generator 190 illustrated in FIG. 3 in accordance with some embodiments of the present invention. Referring to FIG. 7, the wordline voltage generator 190 includes a regulator 191 and a high voltage generating circuit 193. The wordline voltage generator 190 is activated by an enable signal EN generated by the controlling logic 160.

The high voltage generating circuit 193 may comprise charge pump circuit. The high voltage generating circuit 193 generates a wordline voltage Vpgm as a program voltage in response to the clock signal CLK generated by the regulator 191. The regulator 191 receives the level Vpgm_LEVEL value of the wordline voltage Vpgm generated by the high voltage generating circuit 193 and the level Vpgm_LEVEL value of the wordline voltage generated by the wordline voltage controller 180 to control the generation of the clock signal CLK. As the generation of the clock signal CLK is controlled, the level of the wordline voltage Vpgm generated by the high voltage generating circuit 193 is generally uniformly maintained.

Figure 8:
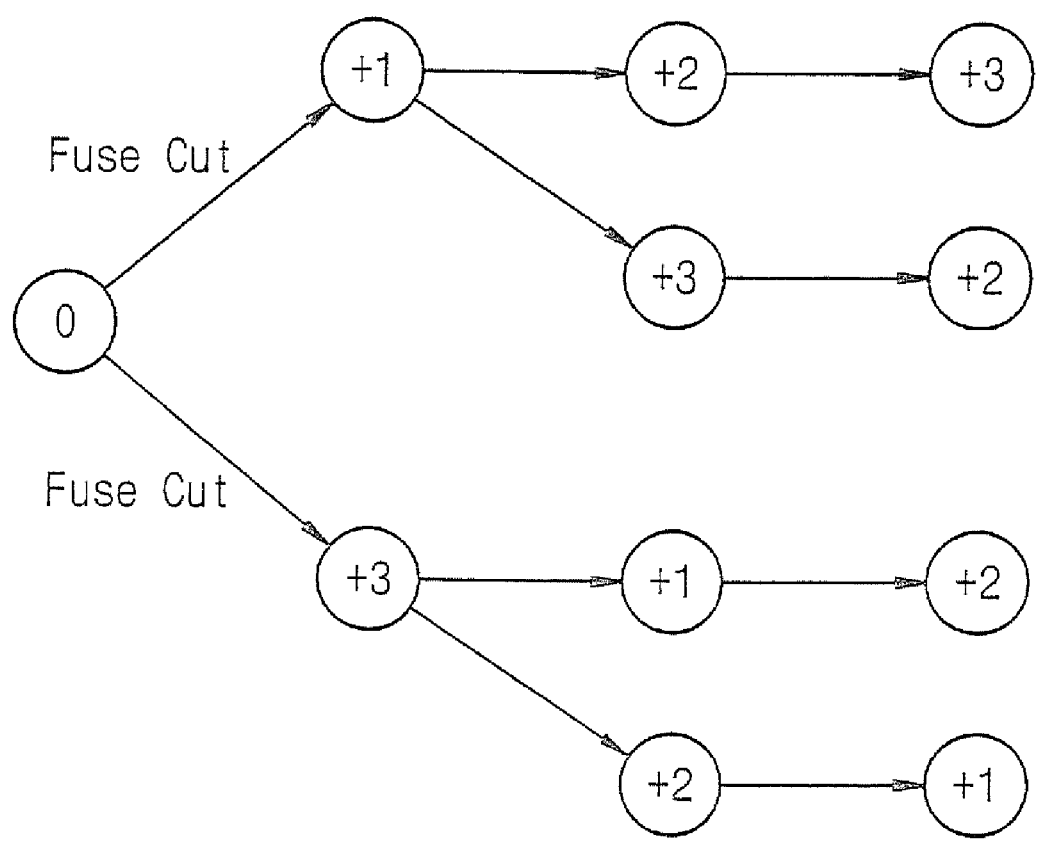
FIG. 8 illustrates an example of controlling the initial levels of wordline voltages in accordance with the cutting of fuses illustrated in FIGS. 5 and 6 according to some embodiments of the present invention.

FIG. 8 illustrates an example of controlling the initial level values of wordline voltages in accordance with the cutting of fuses illustrated in FIGS. 5 and 6 according to some embodiments of the present invention. In FIG. 8, an example of the cutting of four fuses that can represent the initial level values of four bits in each fuse box is illustrated. In FIG. 8, 0, 1, 2, and 3 denote the numbers of fuses used for representing the initial level values of four bits. The fuse represented by 0 denotes the first bit of the least significant bits (LSB) of the initial level value of four bits and the fuses represented by 1, 2, and 3 denote the second, third, and fourth bits of the LSBs of the initial level value of four bits.

For example, after the fuse (represented by 0) corresponding to the first bit of the LSBs of the initial level value of four bits is cut, when it is desired that the initial level of the wordline voltage of the corresponding wordline be changed, the fuses corresponding to the second bit (represented by 1) and the fourth bit (represented by 3) of the LSBs of the initial level value may be selectively cut. After the fuse corresponding to the second bit (represented by 1) of the LSBs of the initial level value is additionally cut, when it is desired that the initial level of the wordline voltage of the corresponding wordline be further changed, the fuses corresponding to the third bit (represented by 2) and the fourth bit (represented by 3) of the LSBs of the initial level value may be selectively cut. According to such operations of fuses, it may be possible to additionally correct the initial levels of the wordline voltages having fixed values.

Figure 9:
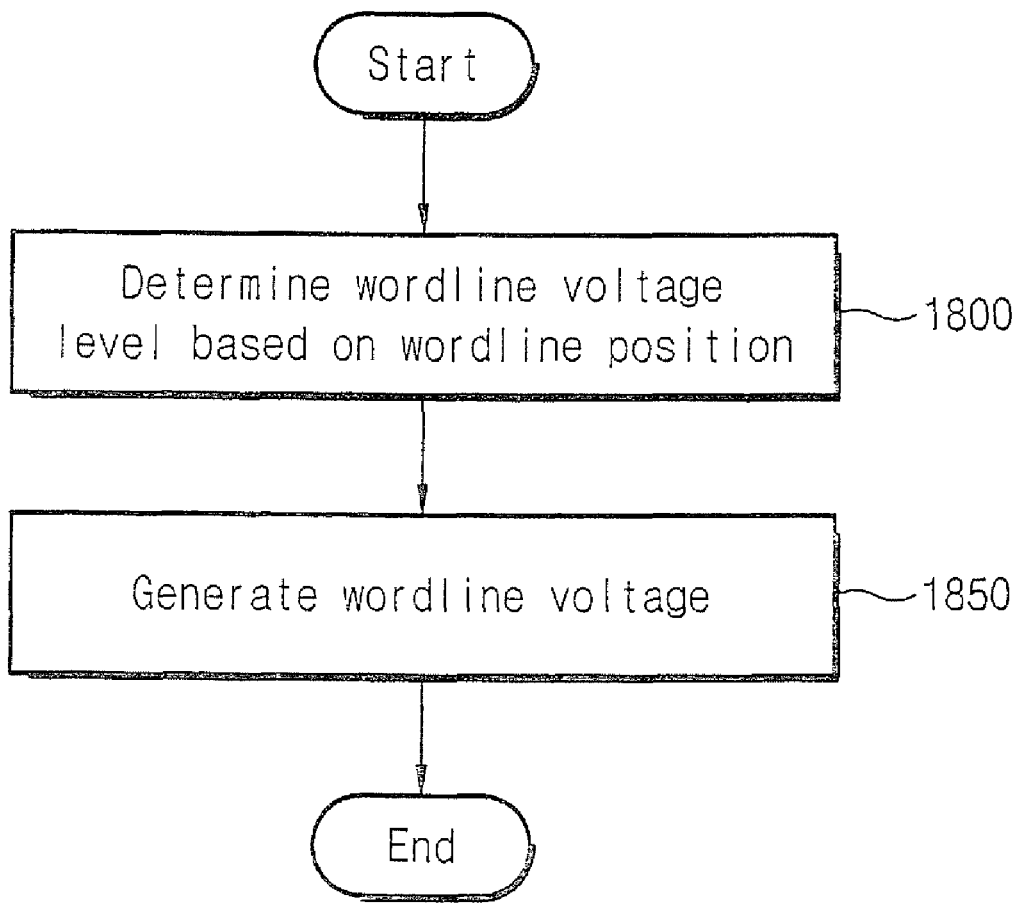
FIG. 9 is a flowchart illustrating methods of controlling a wordline voltage according to some embodiments of the present invention.

FIG. 9 is a flowchart illustrating a method of controlling wordline voltages according to some embodiments of the present invention. Referring to FIGS. 3 and 9, the nonvolatile memory device 100 according to some embodiments of the present invention determines the levels of wordline voltages to be supplied to parts of the respective wordlines or to the entire wordlines based on information on the positions of wordlines (block 1800). Then, the nonvolatile memory device 100 generates the wordline voltages having the determined levels (block 1850).

The levels of the respective wordline voltages to be supplied to the respective wordlines are determined in accordance with information on the positions of the wordlines arranged in the blocks of the memory cell array 110. For example, when the corresponding wordline is positioned in the outermost portion of the memory block of the memory cell array 110, the wordline voltage to be supplied to the wordline is controlled to have a higher value than the wordline voltage to be supplied to the other wordlines. Such a method of controlling the wordline voltages can be applied when the wordline voltage is used as the program voltage as well as when the wordline voltage is used as the reading voltage.

To determine the levels of the wordline voltages, according to some embodiments of the present invention, the initial levels of the wordline voltages to be supplied to the respective wordlines are set. Then, the levels of the wordline voltages are determined based on the initial levels. In particular, when the wordline voltage is used as the program voltage, the initial levels of the wordline voltages to be supplied to the respective wordlines are set. Then, a count-up operation is performed such that the step control signals are generated using the initial level values as a start. The levels of the wordline voltages are determined in response to the counting result performed by the counter. In such a case, the wordline voltage applied to the wordline in the outermost portion of the memory block is controlled to have a higher value than the other wordlines that perform a program operation of the same step.

Nonvolatile memory devices and methods of controlling the wordline voltage of the same, according to some embodiments of the present invention, have been described above in which the levels of the wordline voltages to be supplied to parts of the respective wordlines or to the entire wordlines are determined in accordance with information on the positions of the wordlines. As a result, it may be possible to prevent the number of program loops in accordance with the positions of the wordlines from increasing such that it may be possible to improve the programming characteristic of the nonvolatile memory device and to improve the reading efficiency.

Thus, according to some embodiments of the present invention, it may be possible to control the levels of the respective wordline voltages applied to the respective wordlines of the nonvolatile memory device such that it is possible to improve the programming and reading performance of the nonvolatile memory device.

In concluding the detailed description, it should be noted that many variations and modifications can be made to the embodiments without substantially departing from the principles of the present invention. All such variations and modifications are intended to be included herein within the scope of the present invention, as set forth in the following claims.

That which is claimed:

1. A nonvolatile memory device having, comprising:
an array of memory cells arranged in rows and columns, the array of memory cells having wordlines associated therewith;
a program controller for sequentially activating step control signals during a program cycle;
a wordline voltage controller for determining levels of wordline voltages to be supplied to the respective wordlines responsive to the step control signals; and
a wordline voltage generator for generating the wordline voltages at the determined levels;
wherein the wordline voltage controller determines the levels of the wordline voltages based on positions of the wordlines;
wherein the wordline voltages for wordlines positioned in the outermost portions of the array of memory cells are greater than the wordline voltages for other wordlines programmed responsive to a same step control signal.

2. The nonvolatile memory device as set forth in claim 1, wherein the wordline voltage controller comprises:
an initial level setting unit for setting initial levels of the wordline voltages to be supplied to the respective wordlines; and
a level determining unit for determining the levels of the wordline voltages based on the initial levels and the step control signals.

3. The nonvolatile memory device as set forth in claim 2, wherein the initial level setting unit comprises:
an initial level storage unit for storing representations the initial levels of the wordline voltages; and
an initial level selecting unit for selecting one among the representations of the initial levels of the wordline voltages in response to a row address of the selected wordline.

4. The nonvolatile memory device as set forth in claim 3, wherein the initial level storage unit comprises fuse boxes that provide the representations of the initial levels of the wordline voltages by combinations of a plurality of fuses.

5. The nonvolatile memory device as set forth in claim 3, wherein the initial level storage unit comprises a register for storing the representations of the initial levels of the wordline voltages.

6. The nonvolatile memory device as set forth in claim 2, wherein the level determining unit comprises:
a counter for performing a count-up operation whenever program loops are performed using the initial levels as a start; and
a decoder for decoding the levels of the wordline voltages in response to the counting result of the counter.

7. The nonvolatile memory device as set forth in claim 1, wherein the wordline voltage generator comprises:
a regulator for generating a high voltage control signal based on the levels of the wordline voltages determined by the wordline voltage controller; and
a high voltage generator for generating a high voltage responsive to the high voltage control signal.

8. A method of controlling a wordline voltage of a nonvolatile memory device having a memory cell array of memory cells arranged in rows and columns, the array of memory cells having wordlines associated therewith, the method comprising:
sequentially activating step control signals during a program cycle;
determining the levels of the wordline voltages to be supplied to the respective wordlines in response to the step control signals; and generating the wordline voltages having the determined levels;

wherein the levels of the wordline voltages are determined based on positions of the wordlines;

wherein the wordline voltages for wordlines positioned in the outermost portions of the array of memory cells are greater than the wordline voltages for other wordlines programmed responsive to a same step control signal.

9. The method as set forth in claim 8, wherein determining the levels of the wordline voltages comprises:

setting initial levels of the wordline voltages to be supplied to the respective wordlines;

performing a count-up operation whenever the step control signals are generated using the initial level values as a start; and determining the levels of the wordline voltages responsive to the counting result of the counter.

* * * * *